(12) United States Patent
Lee et al.

(10) Patent No.: US 7,339,223 B2
(45) Date of Patent: Mar. 4, 2008

(54) SEMICONDUCTOR DEVICES HAVING DUAL CAPPING LAYER PATTERNS AND METHODS OF MANUFACTURING THE SAME

(75) Inventors: Hoo-Ouk Lee, Ulsan (KR); Hyo-Dong Ban, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 104 days.

(21) Appl. No.: 11/422,591

(22) Filed: Jun. 6, 2006

(65) Prior Publication Data

US 2006/0231903 A1    Oct. 19, 2006

Related U.S. Application Data

(62) Division of application No. 10/803,064, filed on Mar. 16, 2004, now Pat. No. 7,081,389.

(30) Foreign Application Priority Data

Mar. 17, 2003    (KR) ............................... 2003-16611

(51) Int. Cl.
*H01L 27/108*    (2006.01)
(52) U.S. Cl. ................ 257/296; 257/298; 257/E27.084
(58) Field of Classification Search ................ 257/296, 257/298, 300, E27.081, E27.084
See application file for complete search history.

(56) References Cited

U.S. PATENT DOCUMENTS

| 6,127,260 | A | 10/2000 | Huang | 438/629 |
|---|---|---|---|---|
| 6,242,809 | B1 | 6/2001 | Lee | 257/764 |
| 6,309,960 | B1 | 10/2001 | Sukekawa | 438/629 |
| 6,326,270 | B1 | 12/2001 | Lee et al. | 438/278 |
| 6,337,282 | B2 * | 1/2002 | Kim et al. | 438/699 |
| 6,387,759 | B1 | 5/2002 | Park et al. | 438/275 |
| 6,423,627 | B1 | 7/2002 | Carter et al. | 438/620 |
| 6,451,708 | B1 | 9/2002 | Ha | 438/738 |
| 6,482,699 | B1 * | 11/2002 | Hu et al. | 438/258 |
| 7,119,389 | B2 * | 10/2006 | Lee et al. | 257/298 |

* cited by examiner

*Primary Examiner*—T. N. Quach
(74) *Attorney, Agent, or Firm*—Marger Johnson & McCollom, P.C.

(57) ABSTRACT

Some embodiments provide a semiconductor substrate having a cell array region and a peripheral circuit region. A plurality of word line patterns are placed in the cell array region, each of which include a word line and a word line capping layer pattern stacked thereon. At least one gate pattern including a gate electrode and a gate capping layer pattern is formed in the peripheral circuit region, the gate capping layer pattern and the word line capping layer pattern having different etching selectivity ratios. A pad interlayer insulating layer and a bit line interlayer insulating layer having approximately the same etching selectivity ratio as the gate capping layer pattern are sequentially formed over a surface of the semiconductor substrate having the gate spacers.

11 Claims, 8 Drawing Sheets

SEMICONDUCTOR DEVICES HAVING DUAL CAPPING LAYER PATTERNS AND METHODS OF MANUFACTURING THE SAME

CROSS REFERENCE TO RELATED APPLICATIONS

This patent application is a divisional of U.S. patent application Ser. No. 10/803,064 filed on Mar. 16, 2004, now U.S. Pat. No. 7,081,389, and claims priority from Korean Patent Application No. 10-2003-0016611 filed on Mar. 17, 2003, the contents of which are hereby incorporated by reference in their entirety.

BACKGROUND OF INVENTION

1. Field of the Invention

The disclosure relates to semiconductor devices, and more particularly, to semiconductor devices having dual capping layer patterns and methods of manufacturing the same.

2. Description of the Related Art

In recent years, there has been increased interest in forming at the same time contact holes which penetrate at least one interlayer insulating layer in a cell array region and a peripheral circuit region. In forming the contact hole, it is important to reduce the number of masks used in a semiconductor fabrication process. So, a gate line of a multi layer structure should be optimized. This is because among the contact holes one which is formed on the gate line should be formed in consideration of an etching selectivity ratio that is different from the interlayer insulating layer. That is, a stable profile should be obtained for a contact resistance of the contact hole. A conventional semiconductor device having the contact hole is explained as follows.

Figure 1:
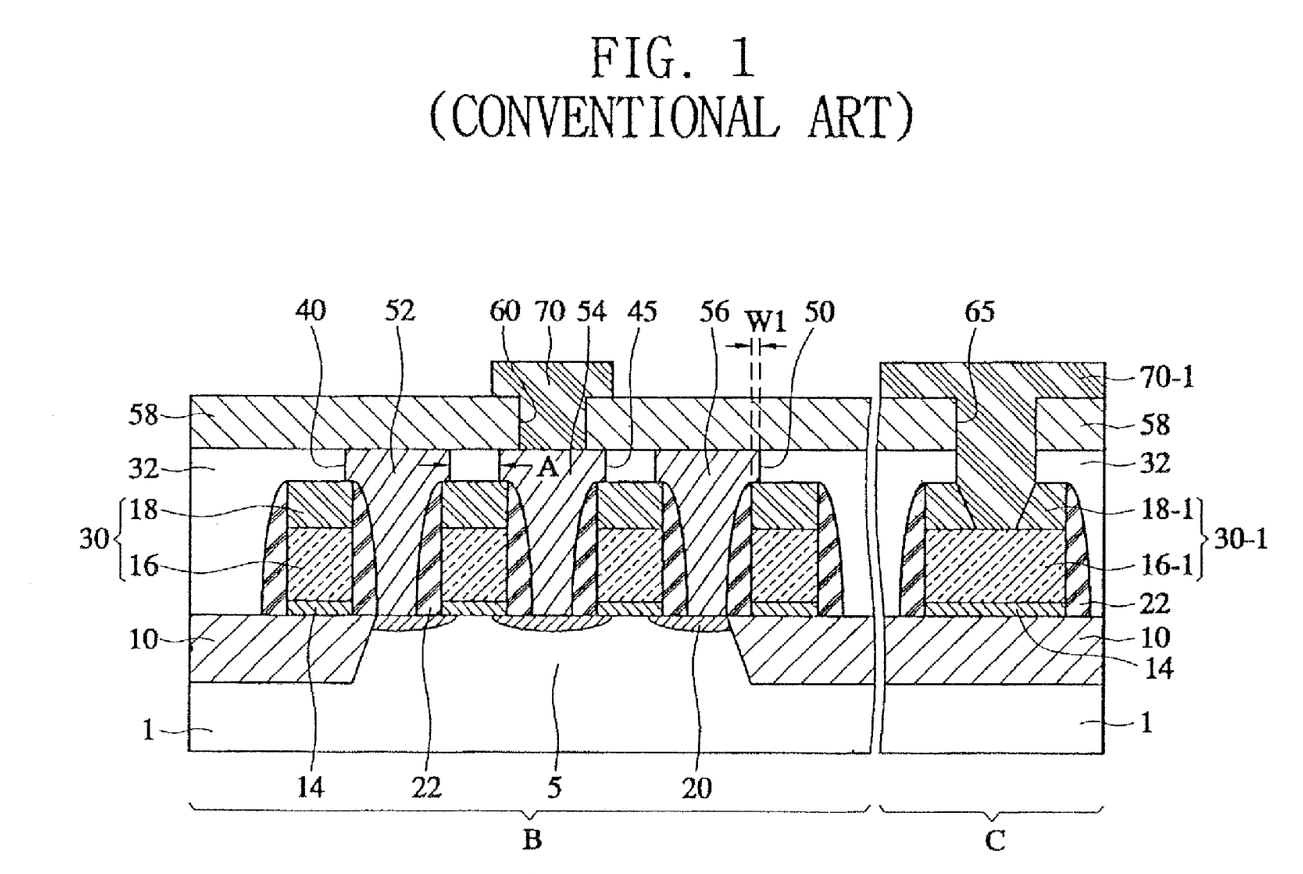
FIG. 1 is a cross-sectional diagram illustrating a semiconductor device according to the conventional art.

FIG. 1 is a cross-sectional diagram illustrating a conventional semiconductor device.

Referring to FIG. 1, a trench separating layer 10 and a gate insulating layer 14 are formed on a semiconductor substrate 1 having a cell array region B and a peripheral circuit region C. A plurality of word line patterns 30 and at least one gate pattern 30-1 are formed on the gate insulating layer 14 in cell array region B and the gate insulating layer 14 in the peripheral circuit region C, respectively. Each of the word line patterns 30 includes a word line 16 and a word line capping layer 18. The gate pattern 30-1 includes a gate electrode 16-1 and a gate capping layer pattern 18-1. The word line 16 and the gate electrode 16-1 are formed of a doped polysilicon layer. The word line capping layer pattern 18 and the gate capping layer pattern 18-1 are formed of a nitride layer. N− low concentration regions 20 are formed on the semiconductor substrate 1 using the word line pattern 30 and the gate pattern 30-1 as a mask. Gate spacers 22 are formed on side walls of the word line pattern 30 and the gate pattern 30-1. The gate spacer 22 is formed of a nitride layer. Also, N+ high concentration regions may be further formed in the semiconductor substrate 1 of the peripheral circuit region by using the gate patterns 30-1 and the gate spacers 22 as a mask, thereby forming a light doped drain (LDD) structure together with the N− low concentration regions 20. A pad interlayer insulating layer 32 is formed over the semiconductor substrate 1 having the gate spacer 22. The pad interlayer insulating layer 32 is formed of an oxide layer. Pad contact holes 40, 45, and 50 are formed in portions of the pad interlayer insulating layer 32 between the word line patterns 18. Landing pads 52, 54, and 56 are formed to fill the pad contact holes 40, 45, and 50, respectively. A bit line interlayer insulating layer 58 is formed over the semiconductor substrate 1 having the landing pads 52, 54, and 56. The bit line interlayer insulating layer 58 is formed of an oxide layer. The bit line interlayer insulating layer 58, the pad interlayer insulating layer 32, and the gate capping pattern 18-1 are sequentially patterned to form a cell contact hole 60 and a peripheral circuit contact hole 65 in the cell array region B and the peripheral circuit region C, respectively. The cell contact hole 60 is formed to expose one selected from the landing pads 52, 54, and 56, and the peripheral circuit contact hole 65 exposes a portion of the gate electrode 16-1. Then, bit lines 70 and 70-1 are formed to fill the cell contact hole 60 and the peripheral circuit contact hole 65, respectively.

In the peripheral circuit region, however, the pad interlayer insulating layer 32 and the bit line interlayer insulating layer 58 have an etching selectivity ratio different from the gate capping layer pattern 18-1. This means that the pad interlayer insulating layer 32 and the bit line interlayer insulating layer 58 differ from the gate capping layer pattern 18-1 in etching amount per a unit time. Therefore, a profile of the peripheral circuit contact hole 65 formed on the gate capping layer pattern 18-1 is different from that of the cell contact hole 60. As a result, since a profile of the peripheral circuit contact hole 65 is not uniform, a process tolerance for the dry etching becomes narrow, and the performance of the semiconductor device deteriorates.

Also, the more a design rule is reduced, the more closely the semiconductor device approaches the limitations of the photolithography process used in forming the pad contact holes 40, 45, and 50. That is, since a gap "A" between the pad contact holes 40, 45, and 50 is reduced to meet a reduced design rule, a short circuit may occur between the landing pads 52, 54, and 56. This results in a problem that an overlapping width W1 between the pad contact holes 40, 45, and 50 and the word line capping layer pattern 18 should be small.

On the other hand, U.S. Pat. No. 6,423,627 to Carter et al. (the '627 patent) discloses a method for forming memory array and periphery contacts using the same mask.

According to the '627 patent, the method includes forming a gate insulating layer on a semiconductor substrate having a memory array region and a peripheral circuit region. A plurality of gate electrodes are formed on portions of the gate insulating layer in the memory array region, and disposable caps are formed on the gate electrodes. At least one gate electrode is formed on a portion of the gate insulating layer in the peripheral circuit region, and a disposable cap is formed on the gate electrode. The width of the gate electrode in the peripheral circuit region is greater than the width of the gate electrode in the memory array region. Spacers are formed on side walls of the gate electrodes and the disposable caps. An initial insulating layer is formed over the semiconductor substrate having the spacers. The initial insulating layer is planarized to expose the disposable caps in the memory array region and the peripheral circuit region. The disposable caps are selectively removed. A first insulating layer is formed over the semiconductor substrate having the initial insulating layer. The first insulating layer is entirely etched back. Here, in the memory array region, the initial insulating layer is exposed and at the same time the first insulating layer is filled in portions corresponding to the disposable caps. In the peripheral circuit region, inward spacers made of the first insulating layer are formed on side walls of the gate electrodes and the spacers, exposing the gate electrode. A second insulating layer is formed over the semiconductor substrate having the inward spacers. A self-aligned contact hole is formed in a region between the gate electrodes to penetrate the initial insulating layer and the second insulating layer and expose the semiconductor substrate. At the same time, a peripheral contact hole is formed in a region between the inward spacers to penetrate the second insulating layer in the peripheral circuit region and expose the gate electrode. The self-aligned contact hole and the peripheral contact hole are formed using a single mask.

However, this method may cause a removal of the disposable cap on the gate electrode and a formation of the first insulating layer on the gate electrode to burden the semiconductor fabrication process. Also, the formation of the inward spacers in the peripheral circuit region can add plasma damage resulting from the gate electrode being exposed to etching gas.

SUMMARY OF THE INVENTION

Some embodiments of the invention provide semiconductor devices having dual capping layer patterns suitable for obtaining uniform contact holes. Other embodiments of the invention provide methods of manufacturing a semiconductor device having dual capping layer patterns capable of obtaining uniform contact holes.

BRIEF DESCRIPTION OF THE DRAWINGS

Exemplary embodiments of the invention will be readily apparent to those of ordinary skill in the art upon review of the detailed description that follows when taken in conjunction with the accompanying drawings, in which like reference numerals denote like parts.

DETAILED DESCRIPTION OF THE INVENTION

Reference will now be made in detail to exemplary embodiments of semiconductor devices having dual capping layer patterns and methods of manufacturing the same of the invention, which are illustrated in the accompanying drawings.

Figure 2:
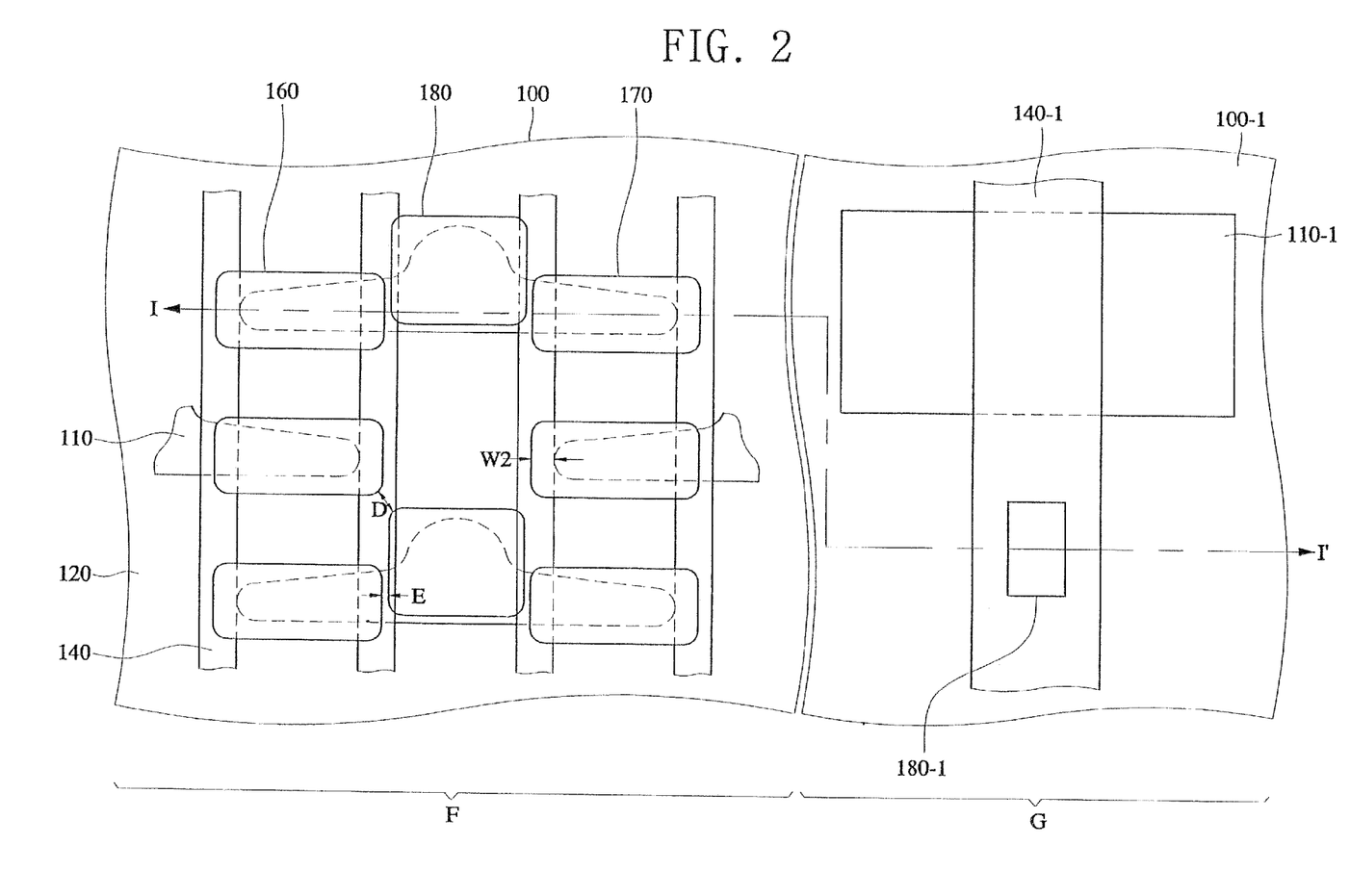
FIG. 2 is a plan diagram illustrating a part of a semiconductor device according to some embodiments of the invention.
Figure 3:
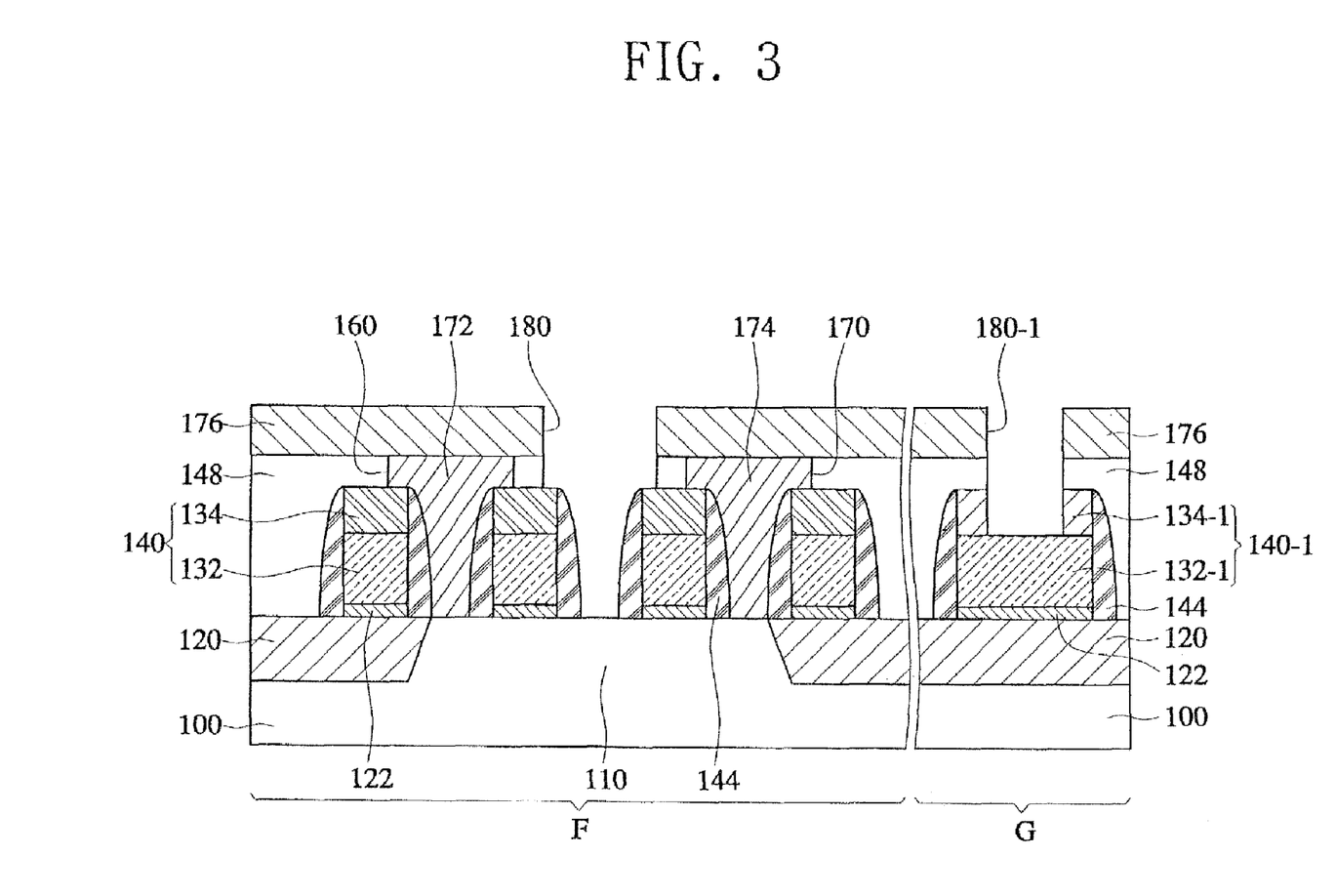
FIG. 3 is a cross-sectional diagram taken along line I-I' of FIG. 2.

FIG. 2 is a plan diagram illustrating a part of a semiconductor device according to some embodiments of the invention. FIG. 3 is a cross-sectional diagram taken along line I-I' of FIG. 2.

Referring to FIGS. 2 and 3, a trench separating layer 120 is placed in a semiconductor substrate 100 having a cell array region F and a peripheral circuit region G. The trench separating layer 120 defines active areas 110 and 110-1. A plurality of word line patterns 140 and at least one gate pattern 140-1 are placed, respectively, in the cell array region F and the peripheral circuit region G of the semiconductor substrate having the trench separating layer 120. The word line pattern 140 includes a word line 132 and a word line capping layer pattern 134 stacked on the word line 132.

The gate pattern 140-1 includes a gate electrode 132-1 and a gate capping layer pattern 134-1 stacked on the gate electrode 132-1. The word line capping layer pattern 134 is an insulating layer having an etching selectivity ratio different from the gate capping layer pattern 134-1. Preferably, the word line capping layer pattern 134 is a nitride layer, and the gate capping layer pattern 134-1 is an oxide layer. Gate spacers 144 are placed on side walls of the word line pattern 140 and the gate pattern 140-1. A pad interlayer insulating layer 148 covers the semiconductor substrate 100 having the gate spacer 144. Preferably, the pad interlayer insulating layer 148 has the same etching selectivity ratio as the gate capping layer pattern 134-1.

Pad contact holes 160 and 170 are placed in regions between the word line patterns 140 to penetrate a portion of the pad interlayer insulating layer 148 in the cell array region F. The pad contact holes 160 and 170 are filled with landing pads 172 and 174. A bit line interlayer insulating layer 176 covers the semiconductor substrate 100 having the landing pads 172 and 174. Preferably, the bit line interlayer insulating layer 176 has the same etching selectivity ratio as the pad interlayer insulating layer 148.

A cell contact hole 180 and a peripheral circuit contact hole 180-1 are placed, respectively, on the semiconductor substrate 100 of the cell array region F and the peripheral circuit region G. The cell contact hole 180 is formed to penetrate the pad interlayer insulating layer 148 and the bit line interlayer insulating layer 176 and expose a portion of the semiconductor substrate 100 between the word line patterns 140 having no landing pads 172 and 174. The peripheral circuit contact hole 180-1 is formed to penetrate the pad interlayer insulating layer 148 and the bit line interlayer insulating layer 176 and expose a portion of the upper surface of the gate electrode 132-1 through a removed portion of the gate capping layer pattern 134-1.

Even though FIG. 2 shows that gaps D and E between the pad contact holes 160 and 170 and the contact hole 180 is smaller than a width of the word line pattern 140 in the cell array region F, a short circuit does not occur due to the bit line interlayer insulating layer 176 interposed between the pad contact holes 160 and 170 and the cell contact hole 180. This can increase a width W2 that the pad contact holes 160 and 170 overlap over the word line pattern 140 compared to the conventional semiconductor device of FIG. 1.

As shown in FIG. 3, since the gate capping layer pattern 134-1, the pad interlayer insulating layer 148, and the bit line interlayer insulating layer 176 have the same etching selectivity ratio in the peripheral circuit region G, the peripheral circuit contact hole 180-1 can have an uniform profile compared to the peripheral circuit contact hole 65 of the conventional semiconductor device of FIG. 1.

FIGS. 4 to 8 are cross-sectional diagrams taken along line I-I' of FIG. 2, illustrating a process of manufacturing a semiconductor device according to some embodiments of the invention.

Figure 4:
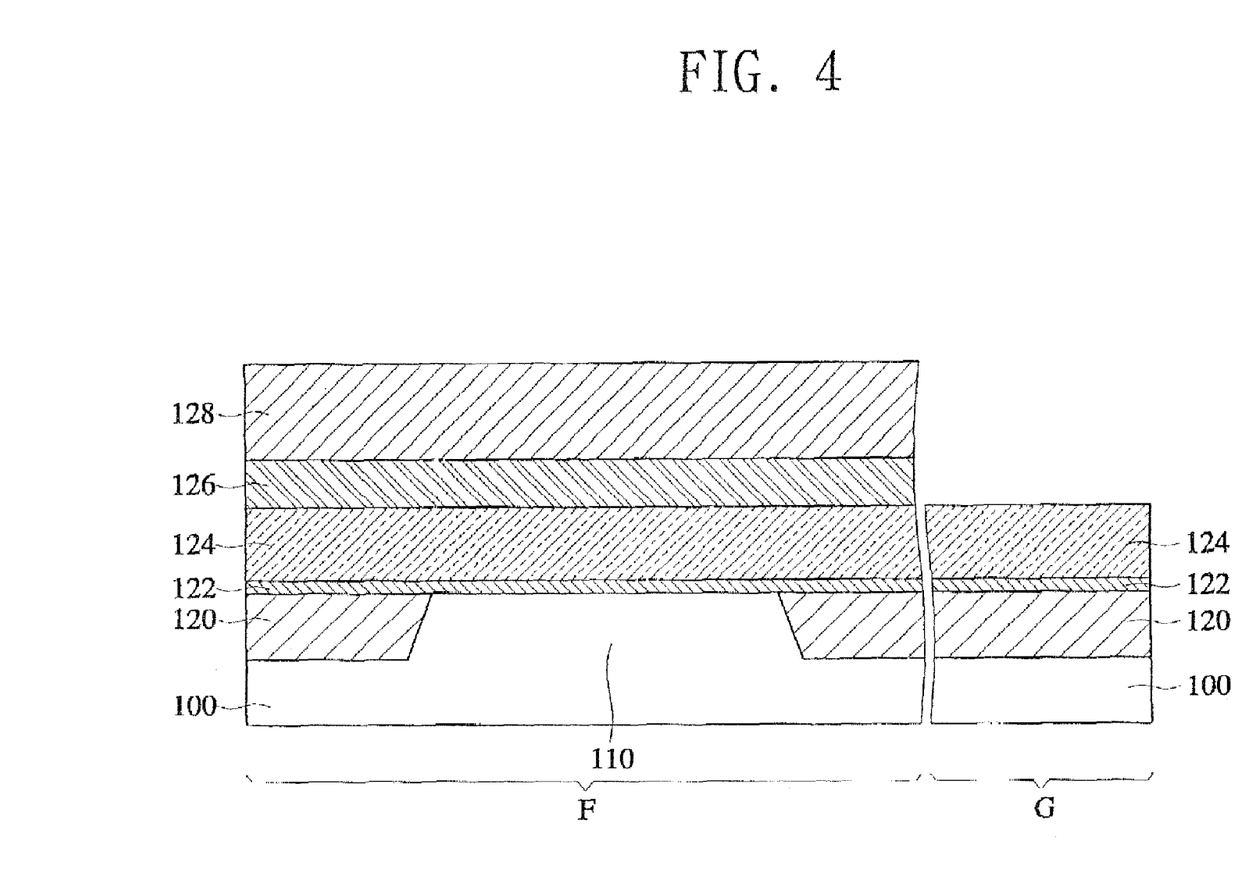
FIGS. 4 to 8 are cross-sectional diagrams taken along line I-I' of FIG. 2, illustrating a process of manufacturing a semiconductor device according to some embodiments of the invention.

Referring to FIG. 4, a trench separating layer 120 is formed on a semiconductor substrate 100 having a cell array region F and a peripheral circuit region G. The trench separating layer 120 defines active areas 110. A gate insulating layer 122, a gate conductive layer 124, a word line capping layer 126, and a photoresist 128 are sequentially formed on the semiconductor substrate 100 having the trench separating layer 120. The gate insulating layer 122 is formed of an oxide layer. The gate conductive layer 124 is formed of a doped polysilicon layer or alternatively of a doped polysilicon layer and a metal silicide layer stacked thereon. The word line capping layer 126 is formed of an insulating layer having an etching selectivity ratio different from the oxide layer. Preferably, the word line capping layer 126 is formed of a nitride layer. Here, a portion of the photoresist 128 in the peripheral circuit region G is removed by a light exposure technique of the well known photolithography process. The word line capping layer 126 is selectively etched to expose the gate conductive layer 124 in the peripheral circuit region G by using the etched photoresist 128 as a mask. The process of selectively etching the word line capping layer 126 is performed by using either a dry-etching process, a chemical mechanical polishing process, or a wet-etching process.

Also, the gate insulating layer 122, the gate conductive layer 124, a gate capping layer (not shown), and the photoresist 128 may be sequentially formed on the semiconductor substrate 100 having the trench separating layer 120. The gate capping layer is formed of an insulating layer having an etching selectivity ratio different from the word line capping layer 126. The gate capping layer is formed of an oxide layer such as flowable oxide (FOX) or spin on glass (SOG). Here, a portion of the photoresist 128 in the cell array region F is removed by using a light exposure technique of the well known photolithography process. The gate capping layer is selectively etched by using the etched photoresist 128 as a mask to expose the gate conductive layer 124. The process of selectively etching the word line capping layer 128 is performed by using either a dry-etching process, a chemical mechanical polishing process, or a wet-etching process.

Figure 5:
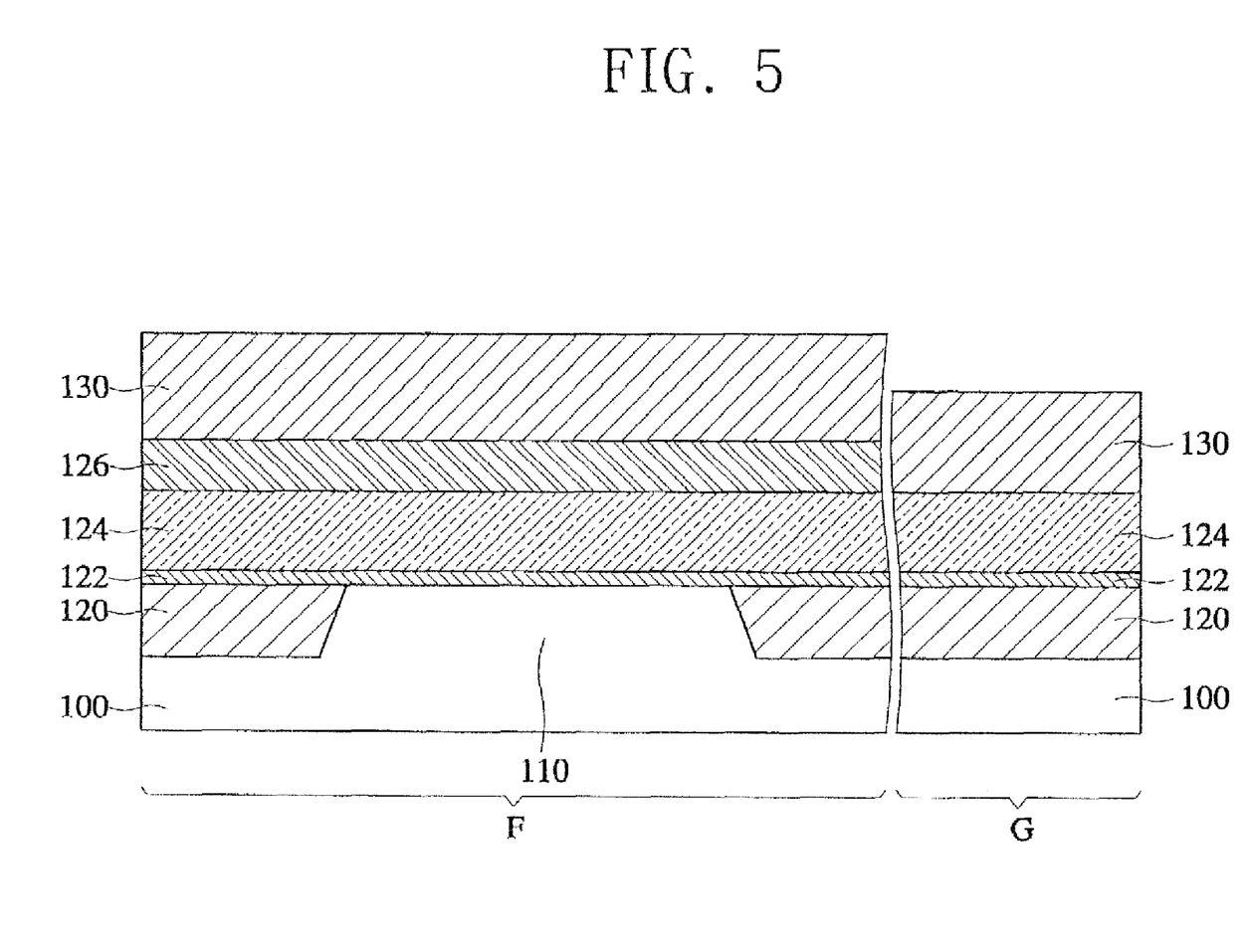

Referring to FIG. 5, the etched photoresist 128 is removed from the semiconductor substrate 100. A gate capping layer 130 is formed over the whole surface of the semiconductor substrate having the etched word line capping layer 126 and the gate conductive layer 124. The gate capping layer 130 is formed of an oxide layer such as flowable oxide (FOX) or spin on glass (SOG) like in FIG. 4.

In the case that the gate insulating layer 122, the gate conductive layer 124, and the etched gate capping layer are sequentially formed over the semiconductor substrate 100 in FIG. 4, the word line capping layer (not shown) can be formed over the semiconductor substrate 100 having the etched gate capping layer and the gate conductive layer 122 after removing the etched photoresist 128 from the semiconductor substrate 100. Preferably, the word line capping layer is formed of a nitride layer like in FIG. 4.

Figure 6:
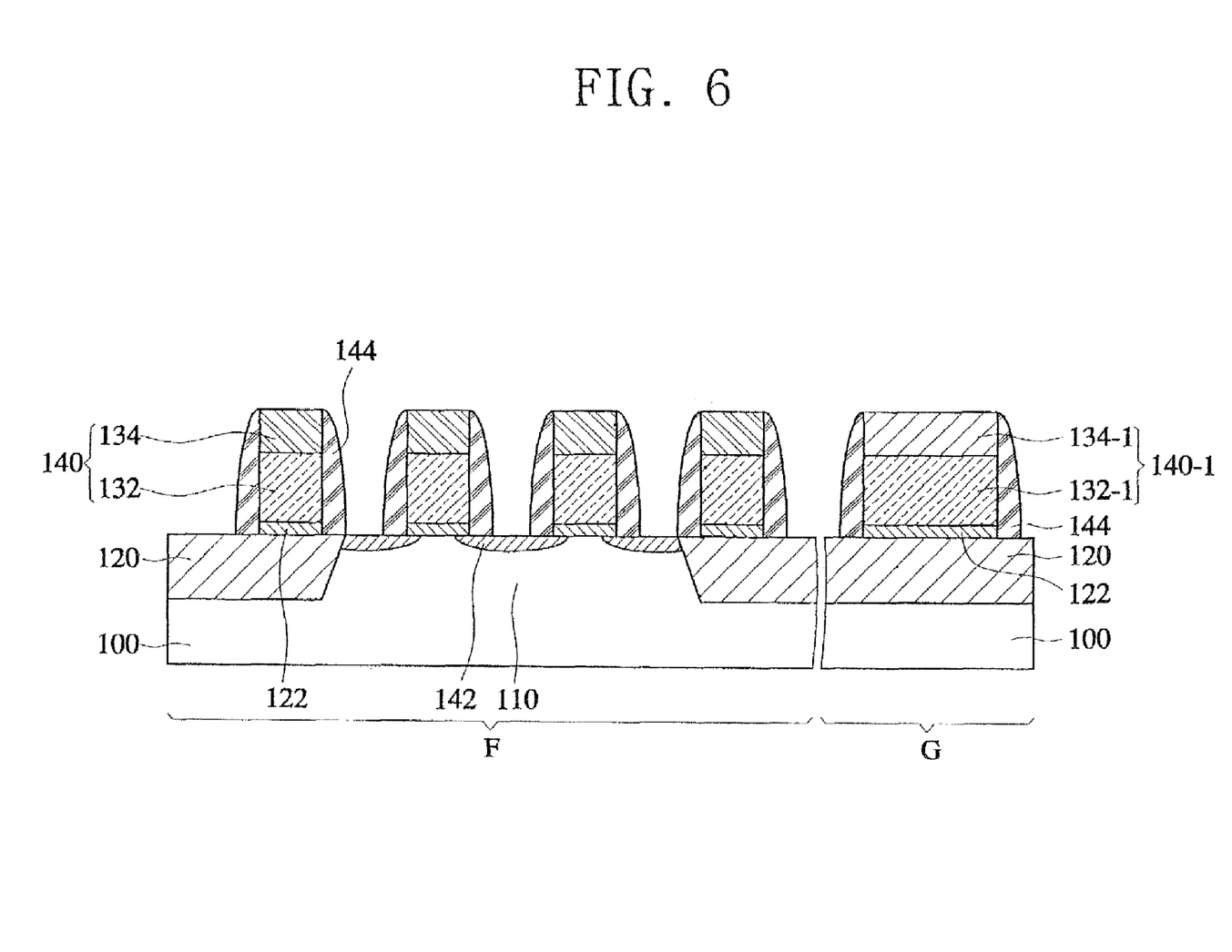

Referring to FIG. 6, when the gate capping layer 130 is formed over the semiconductor substrate having the gate insulating layer 122, the gate conductive layer 124, and the etched word line capping layer 126 in FIG. 5, the gate capping layer 130 is planarized to expose the etched word line capping layer 126 in the cell array region F. Here, the gate capping layer 130 in the peripheral circuit region G selectively remains while exposing the etched word line capping layer 126 in the cell array region F.

Before planarizing the gate capping layer 130, a photoresist (not shown) may be formed on the gate capping layer 130. The photoresist and the gate capping layer 130 are sequentially etched back, so that the photoresist is removed to expose the etched word line capping layer 126 in the cell array region F. Here, the gate capping layer 130 in the peripheral circuit region G selectively remains while exposing the etched word line capping layer 126 in the cell array region F.

Also, in the case that the word line capping layer (not shown) is formed over the semiconductor substrate having the gate insulating layer 122, the gate conductive layer 124, and the etched gate capping layer in FIG. 5, the word line capping layer is planarized to expose the etched gate capping layer in the peripheral circuit region G. Here, the word line capping layer in the cell array region F selectively remains while exposing the etched gate capping layer in the peripheral circuit region G.

Before planarizing the word line capping layer, a photoresist can be formed on the word line capping layer. The photoresist and the word line capping layer are sequentially etched back, so that the photoresist is removed to expose the etched gate capping layer in the peripheral circuit region G. Here, the word line capping layer in the cell array region F selectively remains while exposing the etched gate capping layer 126 in the peripheral circuit region G.

The etched word line capping layer 126, the etched gate capping layer 130, and the gate conductive layer 124 are patterned by using the well known photolithography and etching processes to form a plurality of word line patterns 140 in the cell array region F. Each of the word line patterns 140 includes a word line 132 and a word line capping layer pattern 134 stacked thereon. With the formation of the word line pattern 140 in the cell array region F, at least one gate pattern 140-1 is formed, at the same time, in the peripheral circuit region G. The gate pattern 140-1 includes a gate electrode 132-1 and a gate capping layer pattern 134-1 stacked thereon.

A plurality of the word line patterns 140 may be formed in the cell array region F by patterning the etched word line capping layer and the gate conductive layer 124 in the cell array region F by using the well known photolithography and etching processes. After forming the word line pattern 140, the gate capping layer 130 and the gate conductive layer 124 in the peripheral circuit region G are patterned to form at least one gate pattern 140-1 in the peripheral circuit region G.

Alternatively, at least one gate pattern 140-1 may be first formed in the peripheral circuit region G by patterning the etched gate capping layer 130 and the gate conductive layer 124 in the peripheral circuit region G by using the well known photolithography and etching processes. After forming the gate pattern 140-1, the etched word line capping layer 126 and the gate conductive layer 124 in the cell array region F are patterned to form a plurality of word line patterns 140 in the cell array region F.

The word line capping layer patterns 134 is formed from the etched word line capping layer 126, and the gate capping layer pattern 134-1 is formed from the etched gate capping layer 130. That is, the semiconductor device having the word line pattern 140 and the gate pattern 140-1 has dual capping layer patterns with different etching selectivity ratios.

Impurity ions are implanted into the semiconductor substrate 100 to form N− low concentration regions 142 in both the cell array region F and the peripheral circuit region G by using the word line pattern 140 and the gate pattern 140-1 as a mask. The N− low concentration regions 142 are formed to overlap edges of the word line pattern 140.

Gate spacers 144 are formed on side walls of the word line pattern 140 and the gate pattern 140-1. The gate spacers 144 are formed of an insulating layer having an etching selectivity ratio different from an oxide layer. The gate spacers 144 are preferably formed of a nitride layer. Impurity ions may be implanted into the semiconductor substrate 100 to form N+ high concentration regions in the peripheral circuit region G by using the gate patterns 140-1 the gate spacers 144 as a mask, thereby forming a lightly doped drain (LDD) structure.

Figure 7:
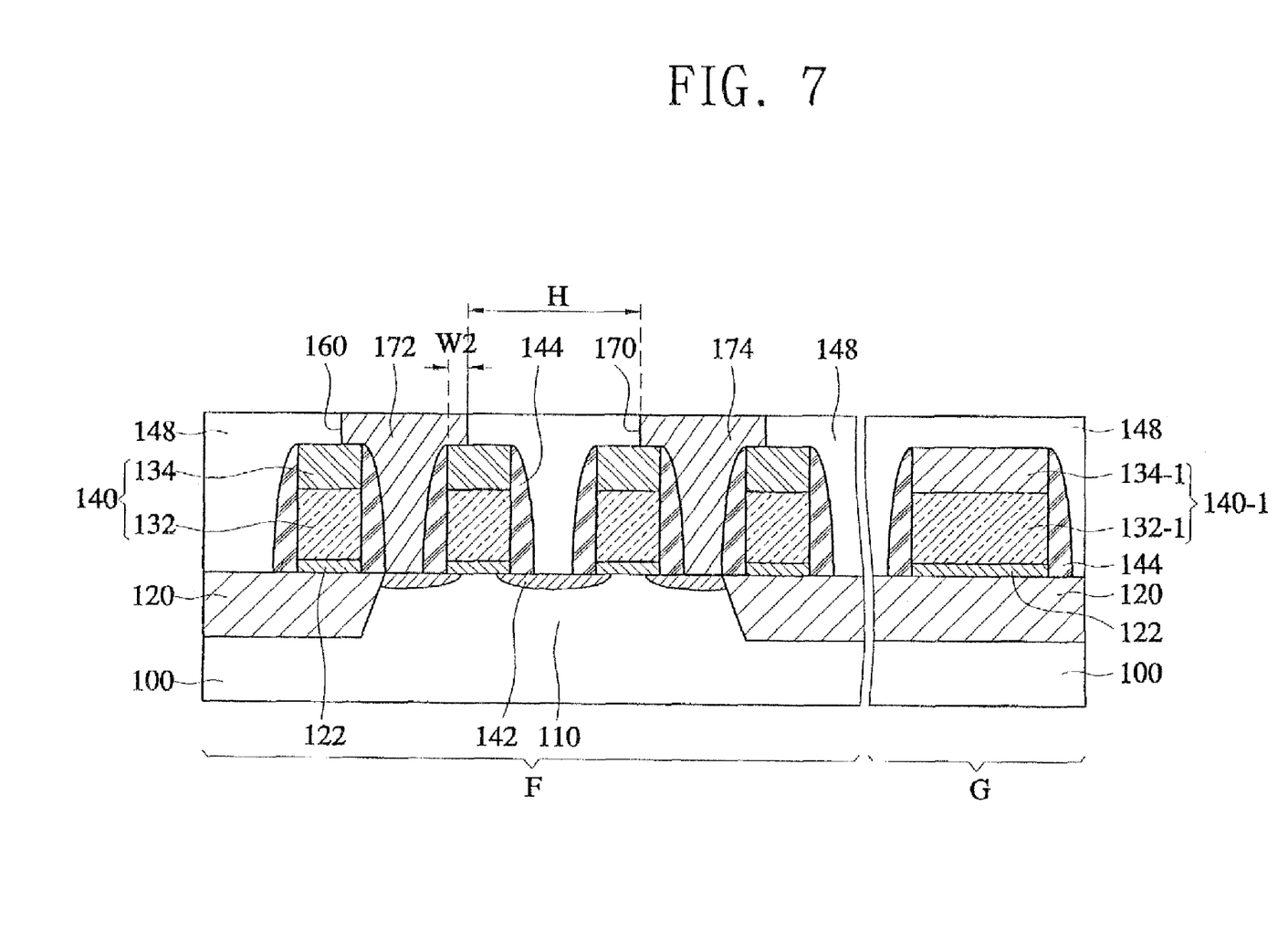

Referring to FIG. 7, a pad interlayer insulating layer 148 is formed over the semiconductor substrate 100 having the gate spacer 144. The pad interlayer insulating layer 148 is formed of an insulating layer having an etching selectivity ratio different from the word line capping layer pattern 134 and the gate spacer 144 in the cell array region F. The pad interlayer insulating layer 148 is formed of an insulating layer having the same etching selectivity ratio as the gate capping layer pattern 134-1. Preferably, the pad interlayer insulating layer 148 is formed of an oxide layer.

Pad contact holes 160 and 170 are formed to penetrate the pad interlayer insulating layer 148 in the cell array region F, thereby to expose a portion of the semiconductor substrate 100 between the word line patterns 140. The pad contact holes 160 and 170 are formed by a self-align method using the word line patterns 140. The pad contact holes 160 and 170 can increase a gap W2 overlapping the word line patterns 140 compared to that of conventional art. This is because an interval H between the pad contact holes 160 and 170 is greater than the pad contact holes 40, 45, and 50 of FIG. 1. This results in an advantage that the pad contact holes 160 and 170 can be formed to actively cope with a gradually reduced design rule.

Landing pads 172 and 174 are formed to fill the pad contact holes 160 and 170. The landing pads 172 and 174 are preferably formed of a doped poly-silicon layer.

Figure 8:
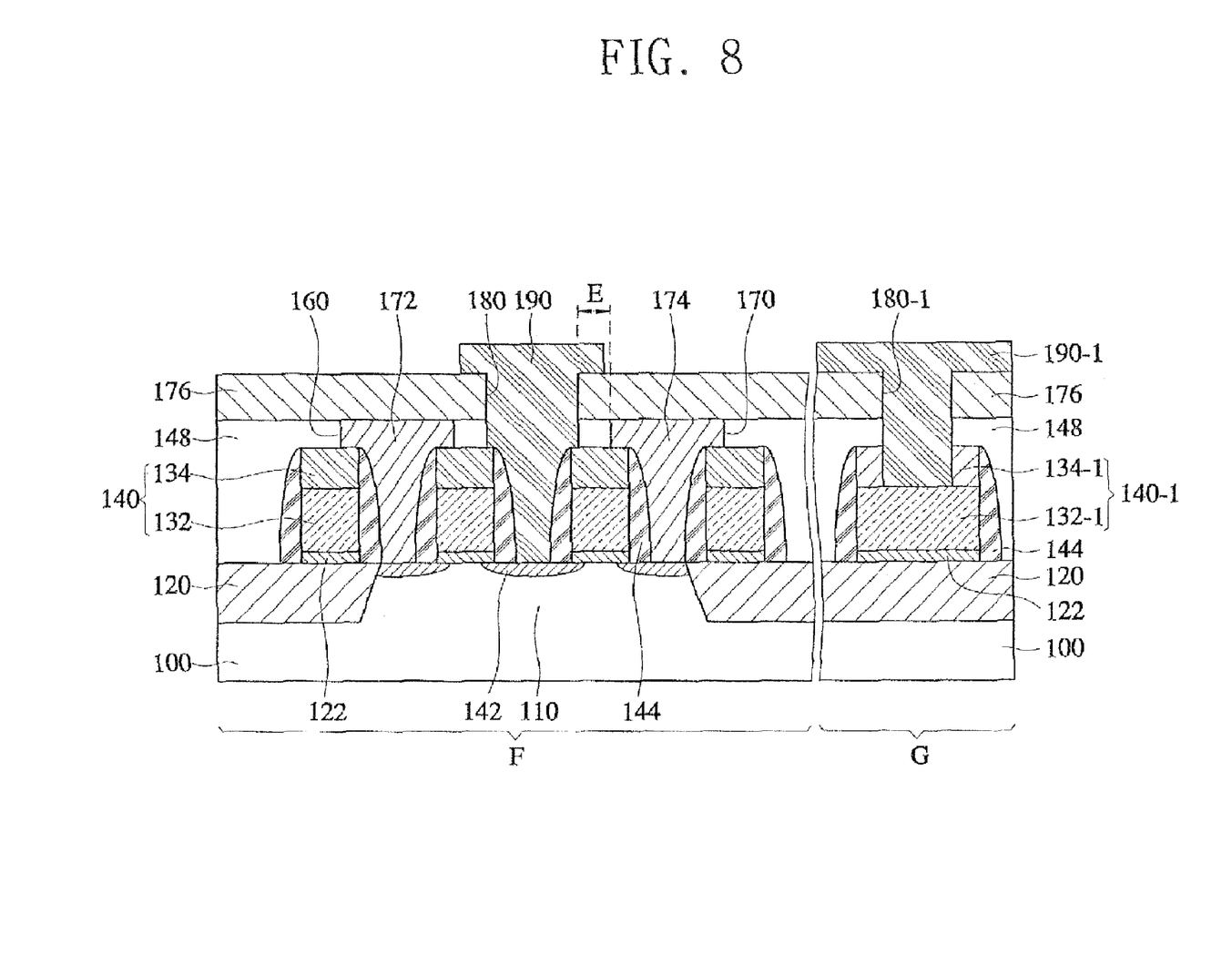

Referring to FIG. 8, a bit line interlayer insulating layer 176 is formed over the whole surface of the semiconductor substrate 100 having the landing pads 172 and 174. The bit line 30 interlayer insulating layer 176 is formed of an oxide layer having the same etching selectivity ratio as the pad interlayer insulating layer 148. A cell contact hole 180 is formed in a region between the word line patterns 140 to penetrate the pad interlayer insulating layer 148 and the bit line interlayer insulating layer 176 in the cell array region F. The cell contact hole 180 is formed to expose a portion of the semiconductor substrate 100 between the word line patterns 140 having no landing pads 172 and 174. With the formation of the cell contact hole 180, a peripheral circuit contact hole 180-1 is formed, at the same time, to penetrate the bit line interlayer insulating layer 176, the pad interlayer insulating layer 148, and the gate capping layer pattern 134-1, exposing a portion of the upper surface of the gate electrode 132-1. The cell contact hole 180 is formed by using a self-align method. Bit lines 190 and 190-1 are formed on the bit line interlayer insulating layer 176 to fill the cell contact hole 180 and the peripheral circuit contact hole 180-1.

The cell contact hole 180 in the cell array region F has a large tolerance in a photolithography process compared to the cell contact hole 60 of FIG. 1. Since the cell contact hole 180 is not formed on the landing pads like FIG. 1, a gap E between the pad contact hole 160 and the cell contact hole 180 can be reduced to a size such that a short circuit between the bit line 190 and the landing pad 172 does not occur, or the gap E between the pad contact hole 170 and the cell contact hole 180 can be reduced to a size such that a short circuit between the bit line 190 and the landing pad 174 does not occur. Therefore, a contact resistance of the cell contact hole 180 is significantly improved. However, since the cell contact hole 60 is formed on the landing pad 54, the cell contact hole 60 is subject to a physical limitation of a photolithography process used during the forming of the landing pads 52, 54, and 56.

Also, the peripheral circuit contact hole 180-1 in the peripheral circuit region G has a uniform profile compared to the conventional art. This is because the peripheral circuit contact hole 180-1 is formed in the gate capping layer pattern 134-1, the pad interlayer insulating layer 148, and the bit line interlayer insulating layer 176, which have approximately the same etching selectivity ratio. Hence, the peripheral circuit contact hole 180-1 can obtain a constant contact resistance.

As described above, the pad interlayer insulating layer and the bit line interlayer insulating layer are sequentially formed over the whole surface of the semiconductor substrate having a plurality of word line patterns in the cell array region and at least one gate pattern in the peripheral circuit region. The word line patterns include the word line and the word line capping layer pattern, and the gate pattern includes the gate electrode and the gate capping layer pattern having an etching selectivity ratio different from the word line capping layer pattern. The gate capping layer pattern has the same etching selectivity ratio as the bit line interlayer insulating layer and the pad interlayer insulating layer. The cell contact hole and the peripheral circuit contact hole are simultaneously formed in the cell array region and the peripheral circuit region, respectively. Here, the peripheral circuit contact hole has a uniform profile along with the cell contact hole. The cell contact hole and the peripheral circuit contact hole can obtain a stable contact resistance, thereby improving a performance of the semiconductor device.

There are many ways to practice the invention. What follows are exemplary, non-limiting descriptions of some embodiments of the invention.

Embodiments of the invention provide a semiconductor device having dual capping layer patterns suitable for obtaining uniform contact holes and a method of manufacturing the same.

According to some embodiments of the invention, there is provided a semiconductor device that includes a semiconductor substrate having a cell array region and a peripheral circuit region. A plurality of word line patterns is placed in the cell array region of the semiconductor substrate, each of the plurality of the word line patterns includes a word line and a word line capping layer pattern stacked thereon. At least one gate pattern is placed in the peripheral circuit region, including a gate electrode and a gate capping layer pattern stacked thereon, the gate capping layer pattern having an etching selectivity ratio different from the word line capping layer pattern. Gate spacers cover side walls of the word line pattern and the gate pattern. A pad interlayer insulating layer and a bit line interlayer insulating layer are sequentially formed over the whole surface of the semiconductor substrate having the gate spacers, and having the same etching selectivity ratio as the gate capping layer pattern. A cell contact hole penetrates the bit line interlayer insulating layer and the pad interlayer insulating layer to place in a predetermined region between the word line patterns. Also, a peripheral circuit contact hole penetrates the bit line interlayer insulating layer, the pad interlayer insulating layer and the gate capping layer pattern to expose the gate electrode.

According to some embodiments of the invention, there is a method of manufacturing a semiconductor device that includes preparing a semiconductor device having a cell array region and a peripheral circuit region. A gate insulating layer and a gate conductive layer are sequentially formed on the semiconductor substrate. A word line capping layer and a gate capping layer are selectively formed on the gate conductive layer in the cell array region and the gate conductive layer in the peripheral circuit region, respectively. The word line capping layer, the gate capping layer, and the gate conductive layer are sequentially patterned to form a plurality of word line patterns in the cell array region and at least one gate pattern in the peripheral circuit region, the word line pattern including a word line and a word line capping layer pattern, the gate pattern including a gate electrode and a gate capping layer pattern. Gate spacers are formed on side walls of the word line pattern and the gate pattern. A pad interlayer insulating layer and a bit line interlayer insulating layer are sequentially formed over the whole surface of the semiconductor substrate having the gate spacers. And the bit line interlayer insulating layer, the pad interlayer insulating layer and the gate capping layer pattern are sequentially patterned to form a cell contact penetrating a region between the word line patterns and a peripheral circuit contact hole exposing the gate electrode.

While the invention has been particularly shown and described with reference to exemplary embodiments thereof, it will be understood by those skilled in the art that the foregoing and other changes in form and details may be made therein without departing from the spirit and scope of the invention as defined in the following claims.

We claim:

1. A semiconductor device, comprising:
    a semiconductor substrate having a cell array region and a peripheral circuit region;
    a plurality of word line patterns placed in the cell array region of the semiconductor substrate, each word line pattern including a word line and a word line capping layer pattern;
    at least one gate pattern including a gate electrode and a gate capping layer pattern located in the peripheral circuit region, the gate capping layer pattern having an etching selectivity ratio different from the word line capping layer pattern;
    a plurality of gate spacers placed on side walls of the word line patterns and the at least one gate pattern;
    a pad interlayer insulating layer having a first etch selectivity;
    a bit line interlayer insulating layer having a second etch selectivity, the bit line interlayer insulating layer sequentially stacked on the pad interlayer insulating layer over a surface of the semiconductor substrate having the gate spacers, the first etch selectivity being approximately the same as the second etch selectivity and an etch selectivity of the gate capping layer pattern;
    a cell contact hole penetrating the bit line interlayer insulating layer and the pad interlayer insulating layer in a region between the word line patterns; and
    a peripheral circuit contact hole penetrating the bit line interlayer insulating layer, the pad interlayer insulating layer, and the gate capping layer pattern to expose the gate electrode.

2. The semiconductor device of claim 1, wherein the word line and the gate electrode comprise a doped polysilicon layer.

3. The semiconductor device of claim 1, wherein the word line and the gate electrode comprise a metal silicide layer.

4. The semiconductor device of claim 1, wherein the word line capping layer comprises a nitride layer.

5. The semiconductor device of claim 1, wherein the gate capping layer comprises an oxide layer.

6. The semiconductor device of claim 5, wherein the oxide layer comprises flowable oxide (FOX).

7. The semiconductor device of claim 5, wherein the oxide layer comprises spin on glass (SOG).

8. The semiconductor device of claim 1, wherein the gate spacer comprises a nitride layer.

9. The semiconductor device of claim 1, further comprising landing pads filing the cell contact hole in the region between the word line patterns.

10. The semiconductor device of claim 1, wherein the pad interlayer insulating layer comprises an oxide layer.

11. The semiconductor device of claim 10, wherein the bit line interlayer insulating layer comprises an oxide layer.

* * * * *

UNITED STATES PATENT AND TRADEMARK OFFICE
CERTIFICATE OF CORRECTION

PATENT NO. : 7,339,223 B2
APPLICATION NO. : 11/422591
DATED : March 4, 2008
INVENTOR(S) : Hoo-Ouk Lee et al.

It is certified that error appears in the above-identified patent and that said Letters Patent is hereby corrected as shown below:

Column 7, line 30, the words "line 30 interlayer" should read -- line interlayer --.

Signed and Sealed this

Twenty-first Day of October, 2008

JON W. DUDAS
*Director of the United States Patent and Trademark Office*